US009634683B1

(12) United States Patent
Lee et al.

(10) Patent No.: US 9,634,683 B1
(45) Date of Patent: Apr. 25, 2017

(54) LOW POWER SIGMA-DELTA MODULATOR ARCHITECTURE CAPABLE OF CORRECTING DYNAMIC RANGE AUTOMATICALLY, METHOD FOR IMPLEMENTING LOW POWER CIRCUIT THEREOF, AND METHOD FOR CORRECTING AND EXTENDING DYNAMIC RANGE OF SIGMA-DELTA MODULATOR AUTOMATICALLY

(71) Applicant: National Cheng Kung University, Tainan (TW)

(72) Inventors: Shuenn-Yuh Lee, Tainan (TW); Jia-Ren Chiou, Kaohsiung (TW); Ching-Chieh Chang, Changhua (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 15/231,770

(22) Filed: Aug. 8, 2016

(30) Foreign Application Priority Data

Nov. 2, 2015 (TW) .............................. 104136086 A

(51) Int. Cl.
*H03M 1/06* (2006.01)
*H03M 1/12* (2006.01)
*H03M 3/00* (2006.01)

(52) U.S. Cl.
CPC ............. *H03M 1/12* (2013.01); *H03M 3/458* (2013.01)

(58) Field of Classification Search
CPC ........ H03M 1/12; H03M 3/458; H03M 1/007; H03M 3/51

USPC ................. 341/143, 155, 144, 118, 120, 139
See application file for complete search history.

(56) References Cited

U.S. PATENT DOCUMENTS

| | | | | |
|---|---|---|---|---|
| 6,087,969 A | * | 7/2000 | Stockstad ............. | H03M 3/394 341/143 |
| 6,700,519 B2 | * | 3/2004 | Yamamoto ............ | H03M 3/498 341/143 |
| 7,417,573 B2 | * | 8/2008 | Chien ................... | H03M 3/474 341/141 |
| 7,532,138 B2 | * | 5/2009 | Akizuki .............. | H03M 7/3015 341/143 |
| 7,580,684 B2 | * | 8/2009 | Cyr ........................ | H01L 24/48 375/298 |
| 7,800,524 B2 | * | 9/2010 | Lee ....................... | H03M 3/486 341/143 |

\* cited by examiner

*Primary Examiner* — Peguy Jean Pierre
(74) *Attorney, Agent, or Firm* — Chun-Ming Shih

(57) ABSTRACT

A low power consumption sigma-delta modulator architecture capable of dynamic detection of output signal strength to change dynamic range, a method for implementing low power consumption circuit thereof, and a method for automatically correcting and extending dynamic range of the sigma-delta modulator are provided. An automatic correction unit is utilized to detect system output signal strength of the sigma-delta modulator, compare system input signal specifications to come out multiple sets of dynamic range curves, and thereby extract an appropriate combination of system order and feed-forward coefficients so as to extend the system dynamic range. The circuit architecture of the automatic correction unit is in a digital circuit form, including a digital signal processor, a counter and register array, a comparator, a digital coefficient controller, a feed-forward gain control unit and a system order control unit.

15 Claims, 5 Drawing Sheets

LOW POWER SIGMA-DELTA MODULATOR ARCHITECTURE CAPABLE OF CORRECTING DYNAMIC RANGE AUTOMATICALLY, METHOD FOR IMPLEMENTING LOW POWER CIRCUIT THEREOF, AND METHOD FOR CORRECTING AND EXTENDING DYNAMIC RANGE OF SIGMA-DELTA MODULATOR AUTOMATICALLY

CROSS-REFERENCE TO RELATED APPLICATIONS

This application claims the priority of Republic of Taiwan Patent Application No. 104136086 filed on Nov. 2, 2015, in the State Intellectual Property Office of the R.O.C., the disclosure of which is incorporated herein by reference.

BACKGROUND OF THE INVENTION

Field of the Invention

The invention relates to a sigma-delta modulator architecture and a method for implementing the same, more specifically to a sigma-delta modulator architecture capable of both low power consumption performance and dynamic range extension, and a method for implementing the same.

Descriptions of the Related Art

In recent years, with evolutions of integrated circuit designs and process technologies, the application scope of sigma-delta modulators gets wider and wider. Applications of sigma-delta modulators are ranged widely from audio signal processing circuits, such as walkman, sounder and hearing aid for medical use, to biomedical instrument, such as electrocardiographic signal measurement instrument. Also, the evolution of integrated circuit designs requires not only high efficiency, but also low cost and low power consumption. Thus, designers also consider very much with perfect designs that meet requirements for products.

Mostly current technologies only allow improvement of a single function for a circuit. For example, multiple feedback architecture in combination with feedforward path and local feedback are design methods used frequently for increasing dynamic range, such that circuit area and power consumption are increased significantly. Additionally, in traditional design technologies for extending dynamic range, quantizers are redesigned, or hardware is redesigned and architecture is specified again according to specific requirement. However, much time is consumed and design cost is increased indirectly in the design process accordingly.

Therefore, a new sigma-delta modulator architecture and a method for implementing the same to overcome the shortages of conventional technologies described above, such as circuit area being increased significantly and power consumption being increased by increasing dynamic range of sigma-delta modulator, or design time and cost being increased because hardware is redesigned according to specific requirement, are subjects the industry desires to address.

SUMMARY OF THE INVENTION

In view of the issues of conventional technologies described above, the invention provides a low power consumption sigma-delta modulator architecture capable of correcting dynamic range automatically, a method for implementing a low power consumption circuit thereof, and a method for automatically correcting and extending a dynamic range of the sigma-delta modulator in order to extend the dynamic range effectively and meet low power consumption requirement with simplified architecture capable of meeting the requirement of reducing area of integrated circuit design, and in turn, reducing cost of circuit design. The feature of dynamic correction is introduced into the architecture thereof, thereby eliminating preamplifier design, and reducing the design cost of analog signal processing system.

To achieve above object and other objects, the invention provides a sigma-delta modulation unit for converting analog signals and digital signals by means of sigma-delta modulation; an integrator unit for signal processing by utilizing coefficients derived via a continuous sigma-delta architecture algorithm; and an automatic correction unit for comparing a system input signal specification to come out multiple sets of dynamic range curves according to a strength of a system output signal in the sigma-delta modulation unit, and extracting a combination of a system order and feed-forward coefficients for decreasing or increasing the system order so as to extend a system dynamic range when the strength of the system output signal changes.

Selectively, the automatic correction unit includes: a digital signal processor for filtering noise out of the system output signal of the sigma-delta modulation unit, and monitoring the strength of the system output signal; a counter and register array, having a counter for calculating/accepting a signal transmitted by the digital signal processor and for outputting time saved in the register array, and a register array for saving a signal value transmitted by the digital signal processor; a comparator for comparing the signal value output by the register array and a system reference signal, and outputting a digital code; a digital coefficient controller for receiving the digital code; a feed-forward gain control unit and a system order control unit for accepting operation of the digital coefficient controller, such that the digital coefficient controller switches the feed-forward gain control unit and the system order control unit to adjust multiple sets of feed-forward coefficients and the system order in accordance with the digital code, through a combination of the system order and different feed-forward coefficients to extend the system dynamic range; and an integrator control unit for adjusting dynamically circuit coefficients of the integrator unit.

Selectively, the feed-forward gain control unit is for saving multiple sets of feed-forward coefficients, such that the digital coefficient controller triggers the feed-forward gain control unit to switch the feed-forward coefficients used currently to another set of feed-forward coefficients or triggers the system order control unit to switch the system order used currently to another system order when the system output signal exceeds a default value in comparison to a change of the reference signal.

Selectively, an automatic correction unit in the low power consumption sigma-delta modulator architecture capable of correcting dynamic range automatically in the invention monitors a strength of a system output signal. As the strength of the system output signal changes, a system order is decreased or increased by the automatic correction unit to save system power consumption.

The invention provides an integrator unit. An included continuous time transconductance capacitive amplifier is used in each stage of an integrator architecture in the integrator unit as a design basis for structuring in conjunction with oversampling technology and noise shaping technology.

Selectively, control of the counter in the counter and the register array allows an output value of the digital signal processor to be saved for every period of time, and an output peak value saved in the register array is sent to the comparator for comparison as a default period is counted by the counter.

The invention further provides a method for automatically correcting and extending a dynamic range of a sigma-delta modulator, including the steps of: comparing a system output signal and a system input signal and calculating multiple sets of dynamic range curves by means of a dynamic extension algorithm, and extracting a combination of a system order and feed-forward coefficients for decreasing or increasing the system order and saving the combination when a strength of the system output signal changes; inputting a default signal and providing a set of system order and feed-forward coefficients from a system for adjusting and initializing a circuit of the system; and monitoring dynamically an output signal strength of the sigma-delta modulator, and holding initial feed-forward coefficients and system order as a change of the output signal strength does not exceed a default value, or, switching the feed-forward coefficients and the system order until the system is stabilized and achieves power consumption/performance balance.

Selectively, in the step of switching the feed-forward coefficients and the system order, switching the feed-forward coefficients is prioritized until all the saved feed-forward coefficients have been used, and then if the performance/power consumption balance has not been achieved, switching the system order is executed.

Selectively, the dynamic extension algorithm is implemented with a digital circuit, which includes a digital signal processor, a counter and register array, a comparator, a digital coefficient controller, a feed-forward gain control unit and a system order control unit, and an integrator control unit.

Further, the method for automatically correcting and extending a dynamic range of a sigma-delta modulator in the invention may switch a system order according to magnitude of the output signal strength for the system order to be decreased or increased.

The invention further provides a method for implementing a low power consumption circuit employing a low power consumption sigma-delta modulator architecture capable of correcting dynamic range automatically, including the steps of: detecting a system output signal of the sigma-delta modulator architecture, and validating compliance of quality of the system output signal with a predetermined specification; keeping on using recorded system coefficients in case of compliance; recording current system coefficients and adjusting gain of each stage of the integrator in the sigma-delta modulator architecture in case of no compliance; and detecting the system output signal being adjusted, and revalidating the compliance of the quality of the system output signal with the predetermined specification; keeping on using the recorded system coefficients in case of compliance; executing the step of recording the current system coefficients and adjusting the gain of each stage of the integrator in case of no compliance until the quality of the system output signal is in compliance with the predetermined specification.

Accordingly, the concept of a wide dynamic extension algorithm is introduced into the design mechanism of the automatic correction unit in the sigma-delta modulator architecture. Such algorithm may examine the specification of the signal output by the sigma-delta modulator architecture and its distribution range in frequency domain, and compare the desired specification and the system design to generate multiple sets of dynamic range curves accordingly. Moreover, the feed-forward coefficient combination and the system architecture order that may be combined are extracted from the dynamic range curves applicable to the system. Such algorithm is characterized in that stability of the system would not be influenced as the system is under correction. That is, only zeros of signal transfer function would be changed through change of the feed-forward coefficients, while poles of the signal transfer function, i.e., the poles of quantization noise transfer function, would not be influenced. Therefore, in case that the stability of the system is held, the invention is capable of automatically correcting and thus optimally extending the performance of the system for different output signal strengths of the system. Moreover, a digital signal processor in the automatic correction unit can detect and send the system output signal strength to a counter and a register array when the system works. The counter and the register array sample/process the output signal in a certain time period, and output the maximum value used (i.e., output peak value) in the period to a comparator for outputting a digital code to control a digital coefficient controller unit and a system order control unit, such that the digital coefficient controller unit adjusts the system order or operates a feed-forward gain control unit to introduce newly generated feed-forward coefficients for replacing original feed-forward coefficients, so that the purposes of modulating feed-forward coefficients automatically and extending dynamic range are achieved.

In addition, an adjustable sigma-delta modulator architecture is used in the invention for further consideration of system performance balance. In the wide dynamic extension algorithm, the requirement of outputting high resolution is achieved through adjustment of architecture and feed-forward coefficients, and the adjustable system architecture is introduced, such that analog to digital conversion using a higher order sigma-delta modulation unit is not necessary as the strength of the system output signal is large sufficiently. That is, lower order architecture may be used to reduce power consumption of the system effectively. On the contrary, the order is raised to improve system performance as the output signal strength is relatively weak. Thus, the invention concentrates on entire performance, especially pays attention to design technologies with good signal resolution and low power consumption.

Further, with respect to implementation of the low power consumption system, in addition to the use of the automatic correction unit for switching the system order and the feed-forward coefficients, the invention also proposes a programmable amplifier (i.e., programmable sigma-delta modulator) by considering non-ideal effects in circuit through a circuit algorithm. Moreover, a model with coefficients in correspondence with performance and power consumption can be obtained more accurately by creating a simulation environment which integrates circuit specification and non-ideal effects. When the automatic correction unit switches circuit specifications, the system performance can be optimized to achieve both low power consumption and performance requirements.

The purposes, subject matters, features and the achieved effects of the invention would be understood more readily by means of the following detailed description in conjunction with attached drawings.

BRIEF DESCRIPTION OF THE DRAWINGS

The above and other aspects, features and other advantages of the present invention would be more clearly understood from the following detailed description taken in conjunction with the accompanying drawings, in which.

DETAILED DESCRIPTION OF THE PREFERRED EMBODIMENT

Figure 1A:
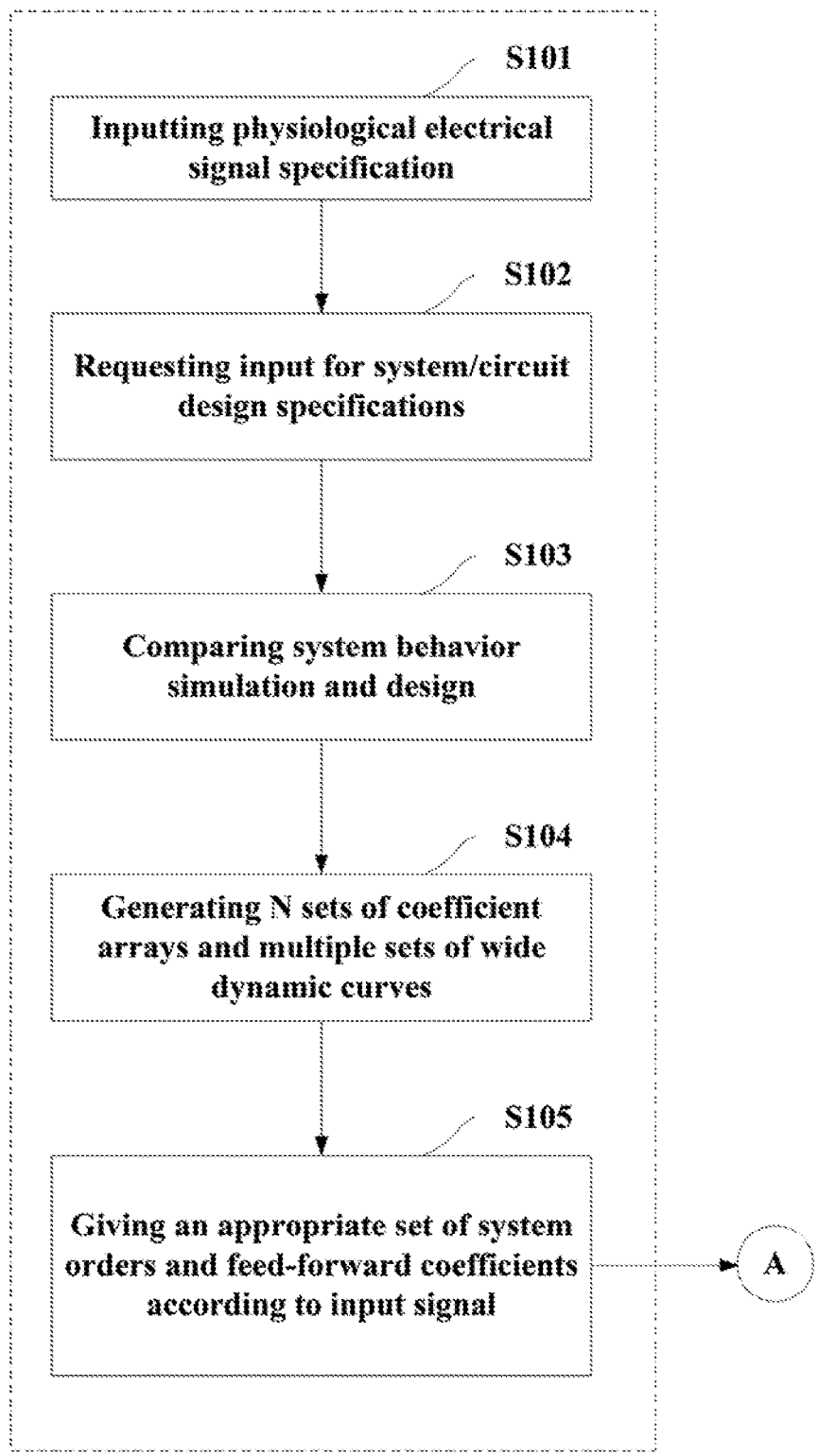
FIGS. 1A and 1B are schematic flowcharts showing a sigma-delta architecture design algorithm and an automatic dynamic range correction/extension executed by a low power consumption sigma-delta modulator architecture capable of correcting dynamic range automatically according to the invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

The invention provides a new sigma-delta modulator architecture and a method for implementing the same, and is related to a high performance algorithm for initialization of a system architecture and for a circuit to perform corresponding adjustment in response to variation of output signal strength. In the method, a dynamic extension algorithm is used by an automatic correction unit to search multiple dynamic range curves, and compare design specification of a system to obtain feed-forward coefficients and a system order required by the sigma-delta modulator. When the output signal strength changes, the feed-forward coefficients and the system order of the sigma-delta modulator are corrected automatically by the automatic correction unit added in the system architecture, and thereby the dynamic range of the sigma-delta modulation unit is extended so as to improve system performance.

Figure 1B:
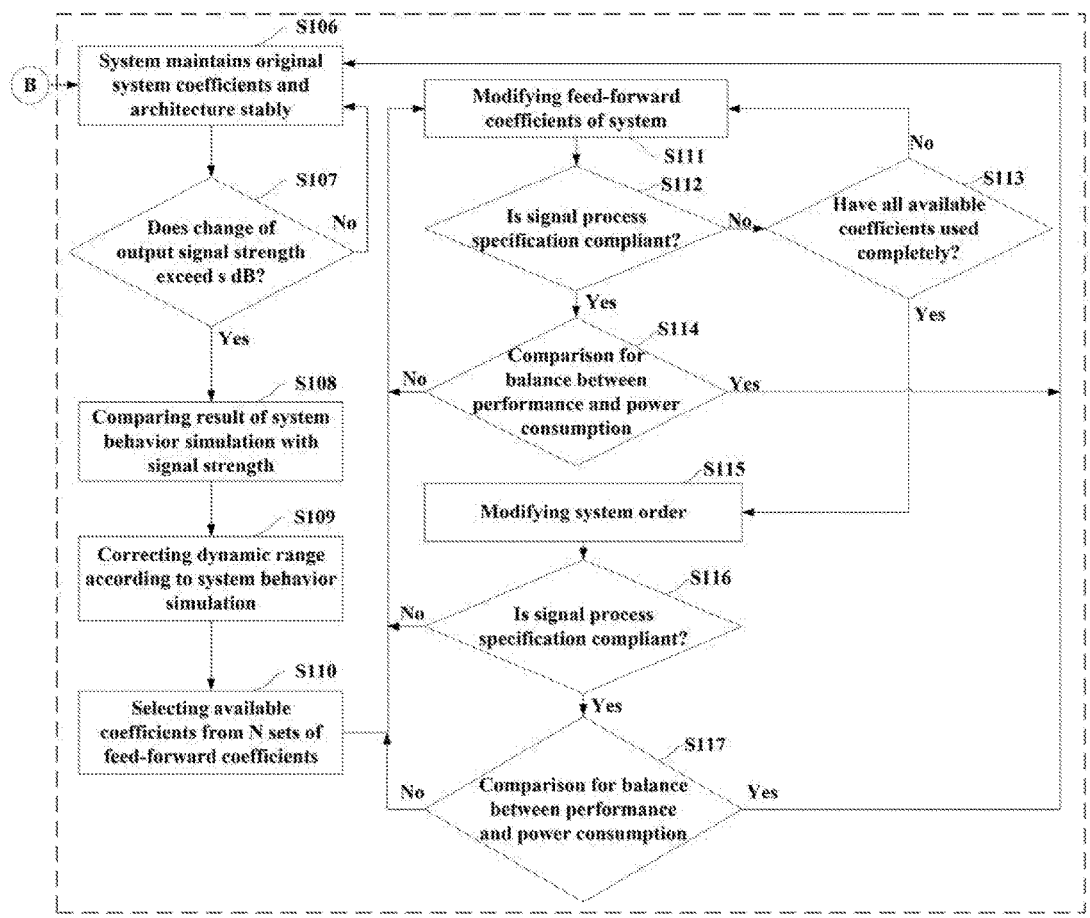

As shown in FIGS. 1A and 1B, which show schematic flowcharts of a dynamic range extension algorithm, which extends dynamic range of a sigma-delta device, used by an automatic correction unit (the automatic correction unit is described in connection with FIG. 2 below) in a low power consumption sigma-delta modulator architecture capable of correcting dynamic range automatically. The flow of the method comprises two phases, the phase for system initialization and creation of feed-forward coefficient array (as shown in FIG. 1A) and the phase of operation after the system starts to work (as shown in FIG. 1B). Step S101 is with respect to inputting physiological electrical signal specification. Step S102 is with respect to inputting circuit design specification and requirement. In step S103, system behavior simulation is utilized for comparison with the design specification. In step S104, N sets of coefficient arrays and multiple sets of wide dynamic curves are generated. In step S105, a set of appropriate system orders and feed-forward coefficients used to initialize the system are given for default input signal. After that, the operation phase is entered after the system starts to work. In step S106, the system maintains the original feed-forward coefficients stably. In step S107, change of strength of a system output signal of the sigma-delta modulator of the invention is determined. As the change of the output signal strength exceeds s dB (s value may be formulated through the system behavior simulation), step S108 compares the signal strength by the result of the system behavior simulation. In step S109, the system behavior simulation is followed and the dynamic range is corrected. In step S110, available coefficients are selected from the N sets of feed-forward coefficients. In step S111, the feed-forward coefficients of the system are corrected. In step S112, after correcting the feed-forward coefficients, compliance of the output signal with signal process specification is determined. In step S113, after correcting the feed-forward coefficients, balance between the system performance of the sigma-delta modulator and the power consumption is determined. In step S114, system order is corrected. In step S115, after correcting the system order, compliance of the system output signal with signal process specification is determined. In step S116, balance between the performance and the power consumption after correcting the system order is determined. In the flow, the automatic correction unit would monitor the output signal strength of the system continuously, so that it holds in the working phase at any time, while step S106 shows that the system is in a stable state.

More specifically, the above steps S101, S102, S103, S104 and S105 show a procedure for the system initialization and creation of the feed-forward coefficients. In step S101, a physiological electrical signal specification for an employing scope is entered. In step S102, system and circuit design specifications, such as bandwidth and resolution, are entered. In step S103, the specifications entered in steps S101 and S102 are subject to system behavior simulation and are compared with the design specification. In step S104, the result produced in step S103 is utilized to generate multiple sets of dynamic range curves so as to generate N sets of feed-forward coefficients. In step S105, a set of system order and feed-forward coefficients are given for adjustment and initialization of the circuit when default signal is entered by utilizing the created hardware architecture. The steps from S106 to S117 shown in FIG. 1B show the operation phase after the system starts to work. In step S106, the initial feed-forward coefficients and system architecture order are held as the output signal strength is not changed. In step S107, it proceeds to S108, the next step, as the change of the output signal strength of the system detected exceeds s dB. For the aforementioned output signal, the architecture shown in FIG. 2 may be utilized for peak value detection of the output signal dynamically by a counter and register array 207. It returns to step S106 if the output signal strength is not changed or the change thereof does not exceed s dB, and the initial feed-forward coefficients and the system architecture order are maintained. In step S108, comparison with the peak value of the output signal is performed in accordance with the system behavior simulation. Moreover, in step S109, the dynamic range is corrected to obtain a better resolution. In step S110, N sets of feed-forward coefficients generated by means of the algorithm in step S104 are selected.

In step S111, the feed-forward coefficients selected in step S110 are substituted into the system to correct the system. In step S112, compliance of the system with signal processing specification after substitution of the feed-forward coefficients is determined. It proceeds to step S113 if there is no compliance; other selected feed-forward coefficients are substituted into the system continuously if there remains other available coefficients; or it proceeds to step S115 if the coefficient combination has been used completely. If the signal meets the specification, it proceeds to step S114, in which the balance between the performance and the power consumption is compared. If the comparison fails, it goes back to S111 for continuing correction of the feed-forward coefficients of the system. If there is compliance, it proceeds to step S106 for maintaining the system in a stable state. In step S115, the system would correct the system order as the available feed-forward coefficients have been used completely. Then, it proceeds to step S116 for determining compliance with the signal processing specification after the system order is corrected. If there is compliance, it proceeds to step S117 for comparing the balance between the power consumption and the performance. If there is no compliance, it goes back to step S111 for selecting other available feed-forward coefficients of the system. In step S117, the balance between the power consumption and the performance is compared after the system order is corrected. If there is compliance, it proceeds to step S106 for holding the system in the stale state. If there is no compliance, it proceeds to step S111 for selecting other available feed-forward coefficients to continue modifying parameters of the system.

The system of the invention is created by examining the circuit design requirement specification of the system and the physiological electrical signal specification using the wide dynamic extension algorithm. The physiological electrical signal specification would be converted into several sets of reference voltages in the wide dynamic extension algorithm in accordance with voltage distribution range thereof, and a particular digital code for recognition would be created. For the circuit design requirement specification of the system, several sets of implementable dynamic range curves would be derived via the wide dynamic extension algorithm to obtain several sets of combinations of feed-forward coefficients and system architecture orders accordingly. After obtaining the combinations of the reference voltage generated from the physiological electrical signal specification and several sets of feed-forward coefficients and system architecture orders, both of which would be compared by the wide dynamic extension algorithm to extract portions of parameter combinations applicable to existing system architecture.

The invention is designed to obtain balance of system performance for fulfilling system requirement with the minimum limited power consumption. The wide dynamic extension algorithm utilizes the automatic correction unit to determine change of the output signal strength dynamically when the system starts to work. If there is change, the counter and register array built in the automatic correction unit are utilized to sample system output signal within a predetermined time period periodically, and the maximum sampling value within that time period is compared/held and output to a subsequent comparator, which implements comparison with the reference voltages and generates a digital code accordingly to control the digital coefficient controller, so that the feed-forward coefficients and the system order can be adjusted appropriately. The algorithm is further designed for setting of performance optimization thereof. During resolution optimization, the system order would be adjusted only after the feed-forward coefficient combinations have been used completely in order to consider balance of performance. On the contrary, the system order and the feed-forward coefficients are adjusted in accordance with the flow to reduce power consumption as the signal quality is better, such that the system achieves low power consumption and has a design with wide dynamic range.

Figure 2:
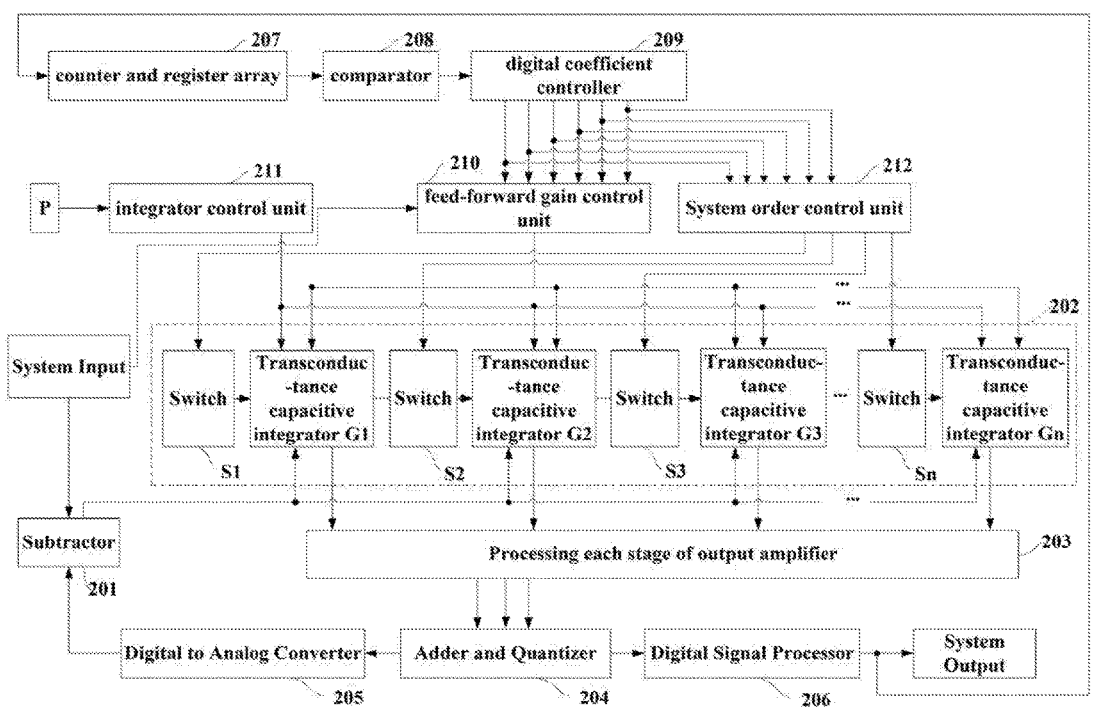
FIG. 2 is a block diagram showing a sigma-delta modulator architecture capable of correcting dynamic range automatically according to the invention.

Next, as shown in FIG. 2, it shows the low power consumption sigma-delta modulator architecture capable of correcting dynamic range automatically according to the invention. It is a digital correction architecture. From the architecture diagram, the system input signal would enter a subtractor 201, in which the input signal and a feedback signal, which has been processed by the sigma-delta modulator, are subject to subtraction and sent to an integrator unit 202 with multiple stages of transconductance capacitive integrators ($G1, G2, \ldots, Gn$) connected in parallel for signal process. The output from each stage of the transconductance capacitive integrators ($G1, G2, \ldots, Gn$) of the integrator unit 202 would be sent to an amplifier 203, which processes the output of each stage for signal amplification, and would be sent to an adder and quantizer 204 for signal superposition and quantization/sampling. The adder and quantizer 204 have two outputs, one is sent to a digital signal processor 206 for filtering out noise to become the system output (acting as digital signal for system feedforward in order for the automatic correction unit to perform dynamic detection during system operation), while the other becomes a feedback signal through a digital to analog converter 205 and is returned to the subtractor 201. The aforementioned automatic correction unit includes a digital signal processor 206, a counter and register array 207, a comparator 208, a digital coefficient controller 209, a feed-forward gain control unit 210, an integrator control unit 211 and a system order control unit 212.

The signal processing part is described essentially above. Subsequently, the technology of correcting signal and system dynamic range automatically and the architecture design thereof are described below. At first, as above, the output of the adder and quantizer 204 is subject to signal processing via the digital signal processor 206 for restoring the output signal peak capable of being recognized, which is sent to the counter and register array 207. The register array is responsible for receiving the output value of the digital signal processor 206 to be saved for every period of time by control of the counter. The time interval can be set by the user according to the input signal in order to obtain the best efficiency. As a certain time period has been calculated by the counter, the maximum output peak value saved in the register array is sent to the comparator 208 for comparison, followed by sending a digital code to the digital coefficient controller 209 for coefficient control. The digital coefficient controller 209 receives the digital code, and in turn, the feed-forward gain control unit 210 is controlled to introduce an appropriate gain for controlling the system order control unit 212 to switch the system order. With respect to the principle, the system input signal is input to the feed-forward gain control unit 210 as a basic signal for the digital coefficient controller unit 209 to impart a gain necessary for the input signal and an appropriate system order, and the dynamic range of the system is adjusted by a combination of the feed-forward coefficients and the system order.

In addition, the integrator control unit 211 shown in FIG. 2 and the feed-forward gain control unit 210 present collectively the wide dynamic extension algorithm illustrated in FIG. 1. For the operation principle of the integrator control unit 211, the integrator control unit 211 would be activated as the system dynamic range meets the requirement of the input signal and there remains room for adjustment of the system. It is known that the integrator unit 202 relies on amplifier providing gain, while sufficient gain can be provided only when voltage and current are provided, which result in power consumption. If the system has sufficient output to meet the requirement of signal processing, the integrator control unit 211 would be influenced for controlling the integrator unit 202 to reduce output gain. Such an approach, which reduces gain by reducing voltage and current, may achieve optimization of the entire system by reducing power consumption on circuit level. The approach here is not limited to adjustment of voltage and current, any parameter which can influence amplifier performance, or any particular mechanism. The concept proposed in the invention is intended to improve the entire system by changing power consumption of a single unit. Therefore, the architecture in FIG. 2 shows an implementation of a sigma-delta modulator architecture capable of correcting dynamic range automatically according to the invention. The order of the sigma-delta modulator may be adjusted to infinite order arbitrarily in accordance with design requirement. In FIG. 2, for example, as the present order is three, switches (S1, S2 and S3) of the transconductance capacitive integrators (G1, G2 and G3) have to be opened simultaneously in order to accomplish signal transfer function of the three order sigma-delta modulator. That is, the switches (S1~Sn) connected with respective stages of the transconductance capacitive integrators (G1~Gn) are controlled by the system order control unit 212 to adjust architecture order of the system. Moreover, the algorithm described for the automatic correction unit is not limited to dependence on this or any particular circuit architecture. Any design architecture similar to the algorithm of the invention should be covered within the scope of the claimed invention.

Further, the digital correction technology according to the invention is based on signal continuation, that is, the input signal is stable within a period of input time T (time T indicates a time interval, which may be set by the user with the interval of time T set according to signal property to guarantee correctness of correction) without large change, so that compliance of the system with specified requirement may be determined by monitoring signal output to see if adjustment is required.

Figure 3:
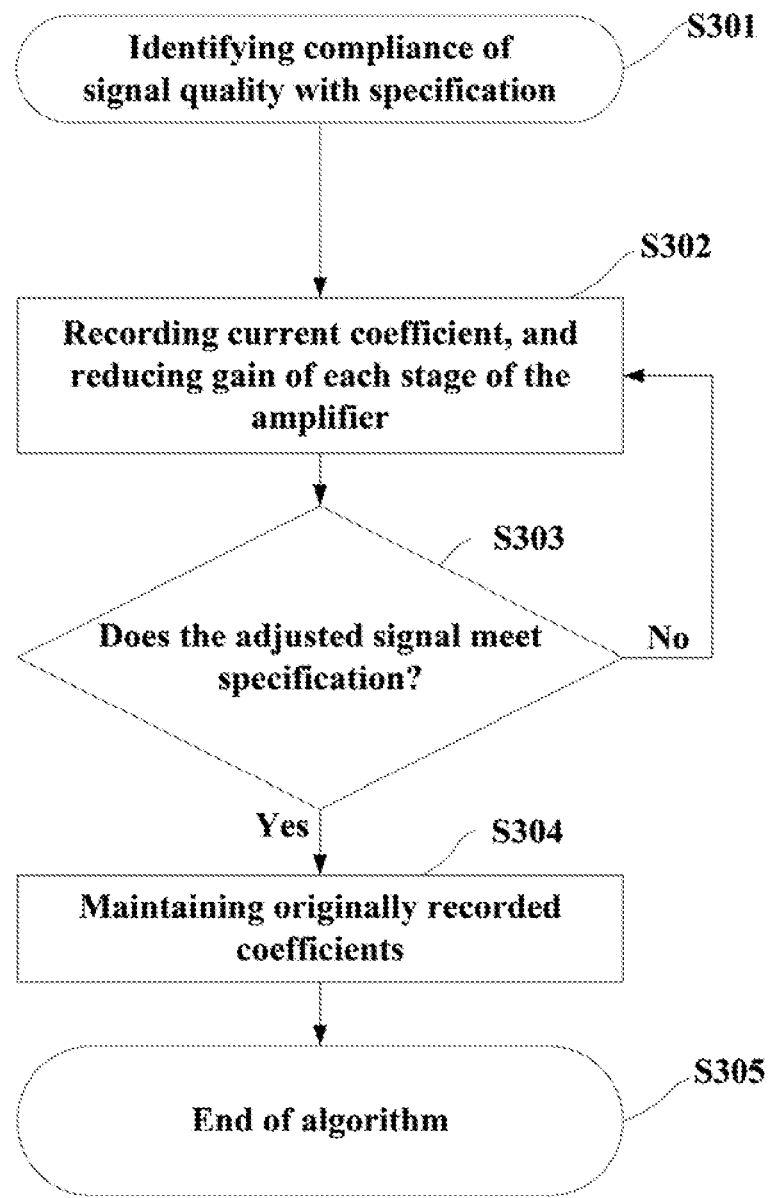
FIG. 3 is a flowchart showing revalidation of signal quality in a method for correcting automatically and extending dynamic range of the sigma-delta modulator according to the invention.

In addition, the invention also provides a circuit algorithm, by which low power consumption and performance are used to compensate for inflexibility of the system architecture. After an external architecture of the integrator has achieved the possible maximum performance which can be achieved in the system level by means of the wide dynamic extension algorithm, the algorithm on the circuit end would be activated automatically after a signal detector detects the system output. As shown in FIG. 3, the processing procedure may be applied to revalidation of signal quality done in step S114 or step S117 shown in FIG. 1. At first, in step S301, the algorithm detects the output signal of the system at the start of the algorithm to guarantee that the output signal quality of the system meets the specification. This continues the wide dynamic extension algorithm to perform revalidation of the signal quality. After the specification meets the system requirement, it proceeds to step S302, in which the algorithm records current coefficients, and reduces gain of each stage of the transconductance capacitive integrators (G1, G2, . . . , Gn). After that, it proceeds to step S303, in which the algorithm determines compliance of the adjusted signal with the specification. If there is no compliance, it returns to step S302, in which the algorithm performs gain adjustment. On the contrary, if the minimum quality requirement for signal of the system is met, it proceeds to step S304, in which the algorithm maintains the use of the coefficients, which meet the minimum specified signal quality, recorded by the algorithm in step S302. At last, it proceeds to step S305 and the algorithm ends.

In the algorithm, the specification met by the signal quality as guaranteed and mentioned in step S301 is not limited to a particular specification, but any specification may be designed by the user, so that any signal specification detection approach similar to the algorithm should be included in the algorithm. For reducing the gain of each stage of the transconductance capacitive integrators (G1, G2, . . . , Gn) as mentioned in step S302, the user sets the interval for adjustment without limiting to a certain particular value. The algorithm uses dynamic detection and correction technology for the purposes of achieving reduced system and circuit power consumption in order to guarantee that the system can achieve the best power consumption result under compliance with signal quality requirement through detection with irregular time interval. What mentioned above intends to improve performance and extend power life for modern electronic products, especially for biomedical electronic products.

Figure 4:
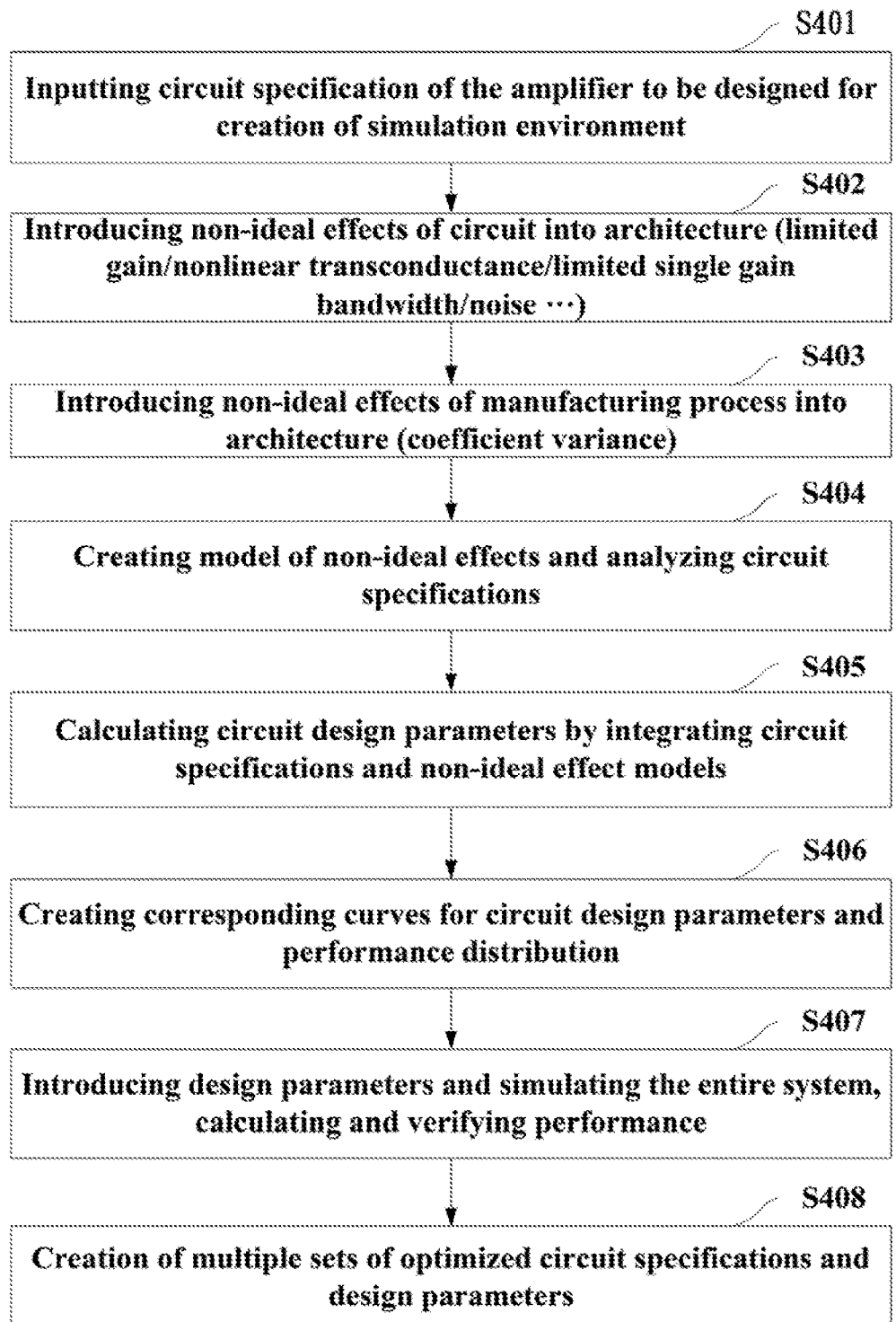
FIG. 4 is a flowchart employing the method for correcting automatically and extending dynamic range of the sigma-delta modulator according to the invention to implement a built-in amplifier circuit of the sigma-delta modulator.

The invention is further characterized in that the output providing performance balance for the system architecture is created. As the required specification is achieved, other combinations of coefficients/orders would be searched or amplifier specification coefficients would be adjusted in order to obtain lower power consumption under the same performance. The creation of multiple sets of coefficient specifications for low power consumption amplifier is disclosed below. At first, as shown in FIG. 4, in step S401, the user needs to enter the amplifier circuit specification to be designed for subsequent creation of non-ideal effect model. In step S402, the non-ideal effects of the circuit itself is introduced into the architecture, wherein limited bandwidth, nonlinear transconductance value, limited single gain bandwidth, parasitic capacitance, noise etc. may be included. In step S403, the non-ideal effects, such as coefficient variation, due to process constraint are included into consideration for architecture simulation. In step S404, a non-ideal effect model with the non-ideal effect of the circuit in step S402 and the non-ideal effect of manufacturing process in step S403 is created with circuit specification analyzed through simulation of the architecture. In step S405, the circuit specification and the non-ideal effect model to be designed are integrated, and circuit design parameter distribution range is simulated. In step S406, the circuit coefficients generated in step S405 would be analyzed, and corresponding curves of circuit design parameters and performance distribution are created through simulation. In step S407, the circuit design parameters are introduced into the entire system to verify whether or not the performance meets the corresponding curves of the circuit parameters and the performance distribution created in step S406. Then, as step S408, if the verification is done, it indicates that the model of the system coefficient corresponding performance generated in consideration of the non-ideal effects has been created, and several sets of optimal circuit specifications for reducing power consumption and the design parameters thereof are obtained.

The examples above are only illustrative to explain principles and effects of the invention, but not to limit the invention. It will be apparent to those skilled in the art that modifications and variations can be made without departing from the scope of the invention. Therefore, the protection range of the rights of the invention should be as defined by the appended claims.

What is claimed is:

1. A low power consumption sigma-delta modulator architecture capable of correcting dynamic range automatically, including:
    a sigma-delta modulation unit for converting analog signals and digital signals by means of sigma-delta modulation;
    an integrator unit for signal processing by utilizing coefficients derived via a continuous sigma-delta architecture algorithm; and
    an automatic correction unit for comparing a system input signal specification to come out multiple sets of dynamic range curves according to a strength of a system output signal in the sigma-delta modulation unit, and extracting a combination of a system order and feed-forward coefficients for decreasing or increasing the system order so as to extend a system dynamic range when the strength of the system output signal changes.

2. The low power consumption sigma-delta modulator architecture capable of correcting dynamic range automatically according to claim 1, wherein the automatic correction unit includes:
    a digital signal processor for filtering noise out of the system output signal of the sigma-delta modulation unit, and monitoring the strength of the system output signal;
    a counter and register array, having a counter for calculating/accepting a signal transmitted by the digital signal processor and for outputting time saved in the register array, and a register array for saving a signal value transmitted by the digital signal processor;
    a comparator for comparing the signal value output by the register array and a system reference signal, and outputting a digital code;
    a digital coefficient controller for receiving the digital code;
    a feed-forward gain control unit and a system order control unit for accepting operation of the digital coefficient controller, such that the digital coefficient controller switches the feed-forward gain control unit and the system order control unit to adjust multiple sets of feed-forward coefficients and the system order in accordance with the digital code, through a combination of the system order and different feed-forward coefficients to extend the system dynamic range; and
    an integrator control unit for adjusting dynamically circuit coefficients of the integrator unit.

3. The low power consumption sigma-delta modulator architecture capable of correcting dynamic range automatically according to claim 2, wherein the automatic correction unit is in the form of a digital circuit for executing a dynamic extension algorithm to compare the system output signal and the system input signal specification and calculate the multiple sets of dynamic range curves so as to extract an appropriate combination of the system order and the feed-forward coefficients.

4. The low power consumption sigma-delta modulator architecture capable of correcting dynamic range automatically according to claim 2, wherein the feed-forward gain control unit is for saving multiple sets of feed-forward coefficients, such that the digital coefficient controller triggers the feed-forward gain control unit to switch the feed-forward coefficients used currently to another set of feed-forward coefficients or triggers the system order control unit to switch the system order used currently to another system order when the system output signal exceeds a default value in comparison to a change of the reference signal.

5. The low power consumption sigma-delta modulator architecture capable of correcting dynamic range automatically according to claim 2, wherein control of the counter in the counter and the register array allows an output value of the digital signal processor to be saved for every period of time, and an output peak value saved in the register array is sent to the comparator for comparison as a default period is counted by the counter.

6. The low power consumption sigma-delta modulator architecture capable of correcting dynamic range automatically according to claim 1, wherein a continuous time transconductance capacitive amplifier is used in each stage of an integrator architecture in the integrator unit as a design basis for structuring.

7. A method for automatically correcting and extending a dynamic range of a sigma-delta modulator, including the steps of:
    comparing a system output signal and a system input signal and calculating multiple sets of dynamic range curves by means of a dynamic extension algorithm, and extracting a combination of a system order and feed-forward coefficients for decreasing or increasing the system order and saving the combination when a strength of the system output signal changes;
    inputting a default signal and providing a set of system order and feed-forward coefficients from a system for adjusting and initializing a circuit of the system; and
    monitoring dynamically an output signal strength of the sigma-delta modulator, and holding initial feed-forward coefficients and system order as a change of the output signal strength does not exceed a default value, or, switching the feed-forward coefficients and the system order until the system is stabilized and achieves power consumption/performance balance.

8. The method for automatically correcting and extending a dynamic range of a sigma-delta modulator according to claim 7, wherein in the step of switching the feed-forward coefficients and the system order, switching the feed-forward coefficients is prioritized until all the saved feed-forward coefficients have been used, and then if the performance/power consumption balance has not been achieved, switching the system order is executed.

9. The method for automatically correcting and extending a dynamic range of a sigma-delta modulator according to claim 7, wherein the dynamic extension algorithm is implemented with a digital circuit, which includes a digital signal processor, a counter and register array, a comparator, a digital coefficient controller, a feed-forward gain control unit and a system order control unit, and an integrator control unit.

10. A method for implementing a low power consumption circuit employing a low power consumption sigma-delta modulator architecture capable of correcting dynamic range automatically according to claim 1, including the steps of:
    detecting a system output signal of the sigma-delta modulator architecture, and validating compliance of quality of the system output signal with a predetermined specification; keeping on using recorded system coefficients in case of compliance; recording current system coefficients and adjusting gain of each stage of the integrator in the sigma-delta modulator architecture in case of no compliance; and detecting the system output signal being adjusted, and revalidating the compliance of the quality of the system output signal with the predetermined specification; keeping on using the recorded system coefficients in case of compliance; executing the step of recording the current system coefficients and adjusting the gain of each stage of the integrator in case of no compliance until the quality of the system output signal is in compliance with the predetermined specification.

11. The method for implementing a low power consumption circuit according to claim 10, wherein the automatic correction unit includes: a digital signal processor for filtering noise out of the system output signal of the sigma-delta modulation unit, and monitoring the strength of the system output signal;
- a counter and register array, having a counter for calculating/accepting a signal transmitted by the digital signal processor and for outputting time saved in the register array, and a register array for saving a signal value transmitted by the digital signal processor;
- a comparator for comparing the signal value output by the register array and a system reference signal, and outputting a digital code;
- a digital coefficient controller for receiving the digital code;
- a feed-forward gain control unit and a system order control unit for accepting operation of the digital coefficient controller, such that the digital coefficient controller switches the feed-forward gain control unit and the system order control unit to adjust multiple sets of feed-forward coefficients and the system order in accordance with the digital code, through a combination of the system order and different feed-forward coefficients to extend the system dynamic range; and
- an integrator control unit for adjusting dynamically circuit coefficients of the integrator unit.

12. The method for implementing a low power consumption circuit according to claim 11, wherein the automatic correction unit is in the form of a digital circuit for executing a dynamic extension algorithm to compare the system output signal and the system input signal specification and calculate the multiple sets of dynamic range curves so as to extract an appropriate combination of the system order and the feed-forward coefficients.

13. The method for implementing a low power consumption circuit according to claim 11, wherein the feed-forward gain control unit is for saving multiple sets of feed-forward coefficients, such that the digital coefficient controller triggers the feed-forward gain control unit to switch the feed-forward coefficients used currently to another set of feed-forward coefficients or triggers the system order control unit to switch the system order used currently to another system order when the system output signal exceeds a default value in comparison to a change of the reference signal.

14. The method for implementing a low power consumption circuit according to claim 11, wherein control of the counter in the counter and the register array allows an output value of the digital signal processor to be saved for every period of time, and an output peak value saved in the register array is sent to the comparator for comparison as a default period is counted by the counter.

15. The method for implementing a low power consumption circuit according to claim 11, wherein a continuous time transconductance capacitive amplifier is used in each stage of an integrator architecture in the integrator unit as a design basis for structuring.

* * * * *